(12) United States Patent
Masuda

(10) Patent No.: US 7,846,780 B2
(45) Date of Patent: Dec. 7, 2010

(54) FLIP-CHIP PACKAGE COVERED WITH TAPE

(75) Inventor: Naomi Masuda, Yokohama (JP)

(73) Assignee: Spansion LLC, Sunnyvale, CA (US)

( * ) Notice: Subject to any disclaimer, the term of this patent is extended or adjusted under 35 U.S.C. 154(b) by 78 days.

(21) Appl. No.: 12/012,388

(22) Filed: Feb. 1, 2008

(65) Prior Publication Data
US 2009/0039531 A1    Feb. 12, 2009

(30) Foreign Application Priority Data
Feb. 2, 2007    (JP) .............................. 2007-023913

(51) Int. Cl.
*H01L 21/56* (2006.01)
(52) U.S. Cl. ..................... 438/126; 438/127; 257/701; 264/272.11; 264/272.17; 264/272.13
(58) Field of Classification Search ................ 257/704; 438/125–126; 264/272.13, 272, 17, 272.11
See application file for complete search history.

(56) References Cited
U.S. PATENT DOCUMENTS

| | | | |
|---|---|---|---|
| 5,858,149 A * | 1/1999 | Seo et al. ..................... 156/150 |
| 2003/0011077 A1* | 1/2003 | Morishima et al. .......... 257/778 |
| 2003/0027371 A1* | 2/2003 | Sunagawa et al. ........... 438/106 |
| 2006/0163750 A1* | 7/2006 | Kaneko ....................... 257/778 |

* cited by examiner

*Primary Examiner*—A. Sefer
*Assistant Examiner*—Allen L Parker

(57) ABSTRACT

A manufacturing method of a semiconductor device includes arranging a melted resin on a substrate, arranging a semiconductor chip on the melted resin, pressing the semiconductor chip and flip-chip mounting the semiconductor chip on the substrate, and hardening the melted resin with the melted resin being subjected to a fluid pressure and forming a resin portion.

14 Claims, 6 Drawing Sheets

FLIP-CHIP PACKAGE COVERED WITH TAPE

CLAIM OF PRIORITY

This applications claims priority from Japanese patent application 2007-023913 filed Feb. 1, 2007 which was not published in English.

TECHNICAL FIELD

This invention generally relates to a semiconductor device, a manufacturing method of the semiconductor device and a manufacturing equipment of the semiconductor device, and in particular, relates to a semiconductor device in which a semiconductor chip is flip-chip mounted, a manufacturing method of the semiconductor device and a manufacturing equipment of the semiconductor device.

BACKGROUND OF THE INVENTION

There is known an art where a semiconductor chip is flip-chip mounted on a substrate with a bump in order to pack the semiconductor chip effectively. In this art, an under fill resin is provided between the substrate and the semiconductor chip. It is possible to restrain an intrusion of foreign substance between the substrate and the semiconductor chip when the under fill resin is provided. Japanese Patent Application Publication No. 2002-319650 discloses an art where a resin sheet covers the flip-chip mounted semiconductor chip. Japanese Patent Application Publication No. 2001-223231 discloses an art where a semiconductor chip is pressed through a film and a resin is injected into between the film and a substrate.

In the conventional flip-chip mounting technology, there is a problem that a void is formed in the under fill resin, in a case where the flip-chip mounting is performed in a high temperature. Adhesiveness, thermal conductivity and humidity resistance of the under fill resin may be reduced when the void is formed in the under fill resin.

SUMMARY OF THE INVENTION

The present invention provides a semiconductor device, a manufacturing method of the semiconductor device and a manufacturing equipment of the semiconductor device that restrain a formation of a void in an under fill resin.

According to an aspect of the present invention, preferably, there is provided a semiconductor device a manufacturing method of a semiconductor device including arranging a melted resin on a substrate, arranging a semiconductor chip on the melted resin, pressing the semiconductor chip and flip-chip mounting the semiconductor chip on the substrate, and hardening the melted resin with the melted resin being subjected to a fluid pressure and forming a resin portion. With the method, it is possible to restrain a formation of a void in the resin portion, because the resin portion is made from the melted resin under the fluid pressure. It is therefore possible to restrain a reduction of adhesiveness, thermal conductivity and humidity resistance of the resin portion.

According to another aspect of the present invention, preferably, there is provided a manufacturing equipment of a semiconductor device including a press portion that presses a fluid pressure to a melted resin arranged on a substrate, a resin formation portion that hardens the melted resin with the melted resin being subjected to a fluid pressure and forms a resin portion, and a mount portion that presses a semiconductor chip arranged on the melted resin and flip-chip mounts the semiconductor chip on the substrate. With the structure, it is possible to restrain a formation of a void in the resin portion, because the press portion presses the fluid pressure to the melted resin.

According to a further aspect of the present invention, preferably, there is provided a semiconductor device including a semiconductor chip that is flip-chip mounted on a substrate, a resin portion that is provided between the semiconductor chip and the substrate, and a resin sheet that covers the semiconductor chip and the resin portion and has a hole on the semiconductor chip. With the structure, it is possible to restrain a formation of a void in the resin portion because the resin sheet is provided. It is further possible to equalize each shape of the resin portions. It is also possible to absorb the semiconductor chip to the substrate through the resin sheet during flip-chip mounting, because the resin sheet has the hole.

DETAILED DESCRIPTION

Figure 1:
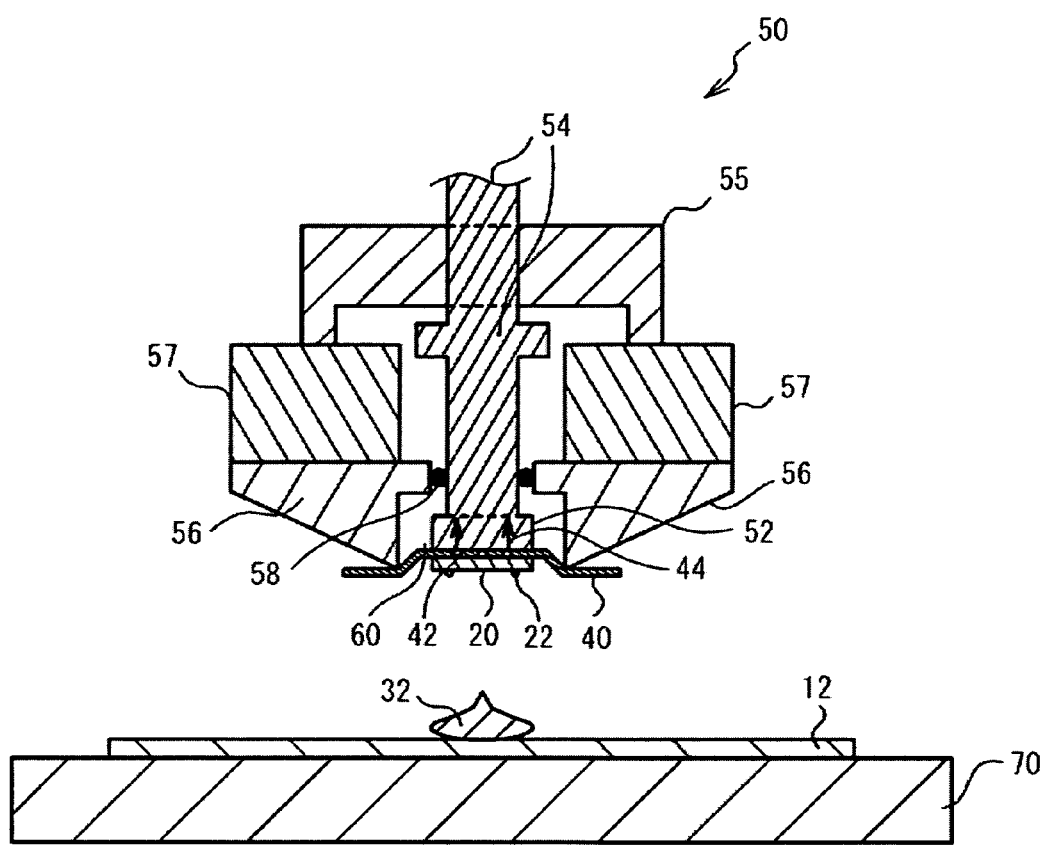
FIG. 1 illustrates a manufacturing method (first case) of a semiconductor device in accordance with a first embodiment.

A description will be given of a manufacturing method of a semiconductor device 10 in accordance with a first embodiment. As shown in FIG. 1, a wiring substrate 12 made of glass epoxy or the like is provided on a stage 70 of a flip-chip bonder 50. There are provided a metal wiring, a land electrode, and a hole connecting a front face and a back face of the substrate 12 on at least one of the front face or the back face of the substrate 12. These components are not shown in FIG. 1 and in the drawings below.

A melted resin 32 made of epoxy-based thermoset resin falls in drops onto the substrate 12. The melted resin 32 may be made of polyimide resin or the like instead of the epoxy-based resin. A thermo plastic resin may be used as the melted resin 32. The flip-chip bonder 50 has a mount portion 54, a connection portion 55, an air cylinder 57 and a metal mold 56. An absorption portion 52 at an end portion of the mount portion 54 absorbs to a back face (a face on an opposite side of a circuit) of a semiconductor chip 20 made of silicon or the like through an epoxy resin sheet 40 having heat resistance. The resin sheet 40 is made of a resin having a melting point higher than that of the melted resin 32. The resin sheet may be made of a resin other than the epoxy resin. There is provided a bump 22 on a front face of the semiconductor chip 20. A hole 42 for absorbing the semiconductor chip 20 is formed in the resin sheet 40. The absorption portion 52 absorbs to the semiconductor chip 20 with vacuum through the hole 42 of the resin sheet 40, as shown on an arrow 44. The resin sheet 40 has a thickness of approximately 20 μm to 50 μm.

The metal mold 56 makes contact with the resin sheet 40 so as to surround the semiconductor chip 20. The metal mold 56 is fixed to the air cylinder 57. The air cylinder 57 may press the metal mold 56 downward when air is provided into the air cylinder 57. An O-ring 58 is provided between the metal mold 56 and the mount portion 54. The metal mold 56, the mount portion 54, the O-ring 58 and the resin sheet 40 form a sealed space 60. The metal mold 56 has a component (not shown) that presses the space 60 by injecting air into the space 60. The metal mold 56 may be exchangeable. A larger metal mold 56 may be used if a larger semiconductor chip 20 is mounted. The air cylinder 57 is coupled to the mount portion 54 with the connection portion 55. The mount portion 54 for flip-chip mounting and the metal mold 56 are coupled with each other so as to be able to press independently.

Figure 2:
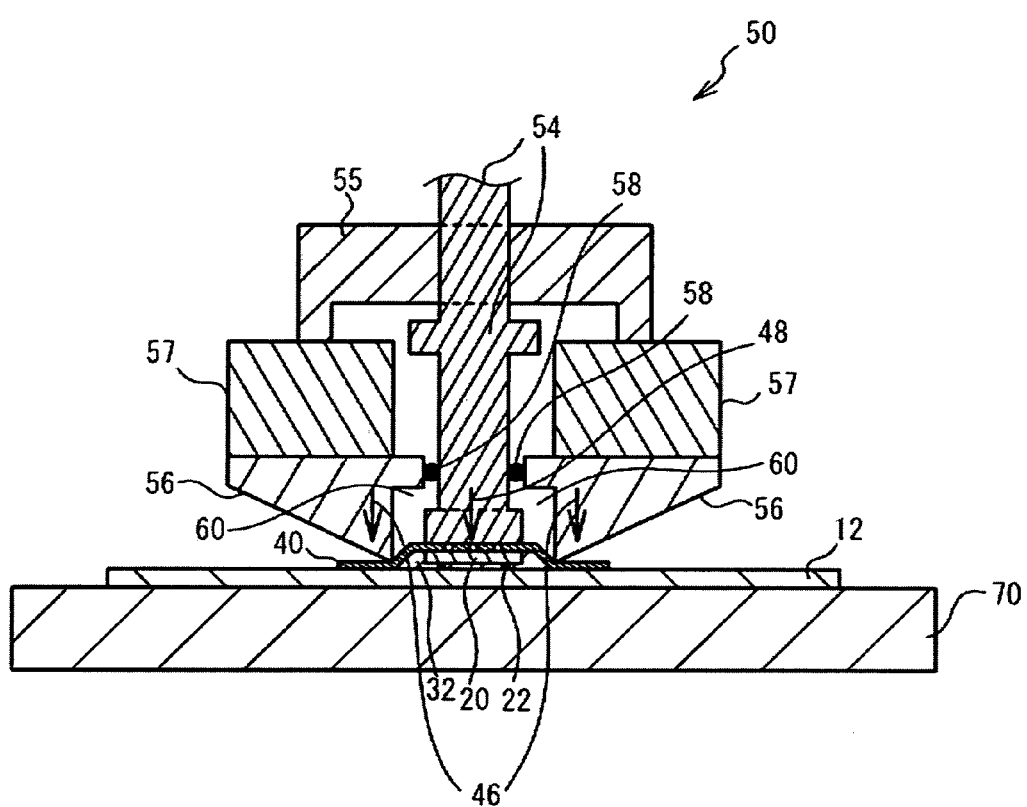
FIG. 2 illustrates the manufacturing method (second case) of the semiconductor device in accordance with the first embodiment.

As shown in FIG. 2, the semiconductor chip 20 is arranged on the melted resin 32. Air is injected into the air cylinder 57. And the resin sheet 40 is pressed to the substrate 12 with the metal mold 56 so as to surround the semiconductor chip 20 as shown on an arrow 46. Further, the semiconductor chip 20 is pressed to the substrate 12 with the mount portion 54 as shown on an arrow 48. Thus, the bump 22 of the semiconductor chip 20 is pressed to an electrode (not shown but shown in FIG. 5 as an electrode 14) on the substrate 12. And the semiconductor chip 20 is flip-chip mounted on the substrate 12.

Figure 3:
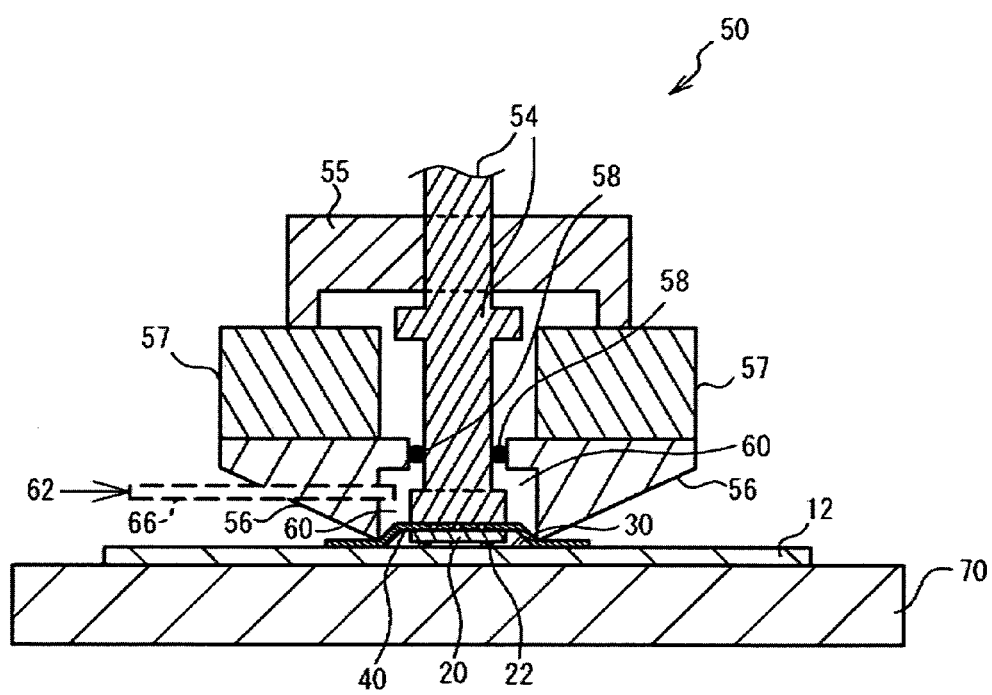
FIG. 3 illustrates the manufacturing method (third case) of the semiconductor device in accordance with the first embodiment.

As shown in FIG. 3, a high-temperature air 62 is injected into the space 60 through an injection portion 66 in a condition shown in FIG. 2. Thus, a pressure in the space 60 gets higher. The pressure in the space 60 is preferably 0.1 MPa to 0.5 MPa. The injection portion 66 is provided in the metal mold 56 and is schematically illustrated in FIG. 3. The melted resin 32 is subjected to a pressure through the resin sheet 40. In the condition, a temperature of the stage 70 is increased. And the melted resin 32 is thermally hardened and an under fill resin 30 is formed.

Figure 4:
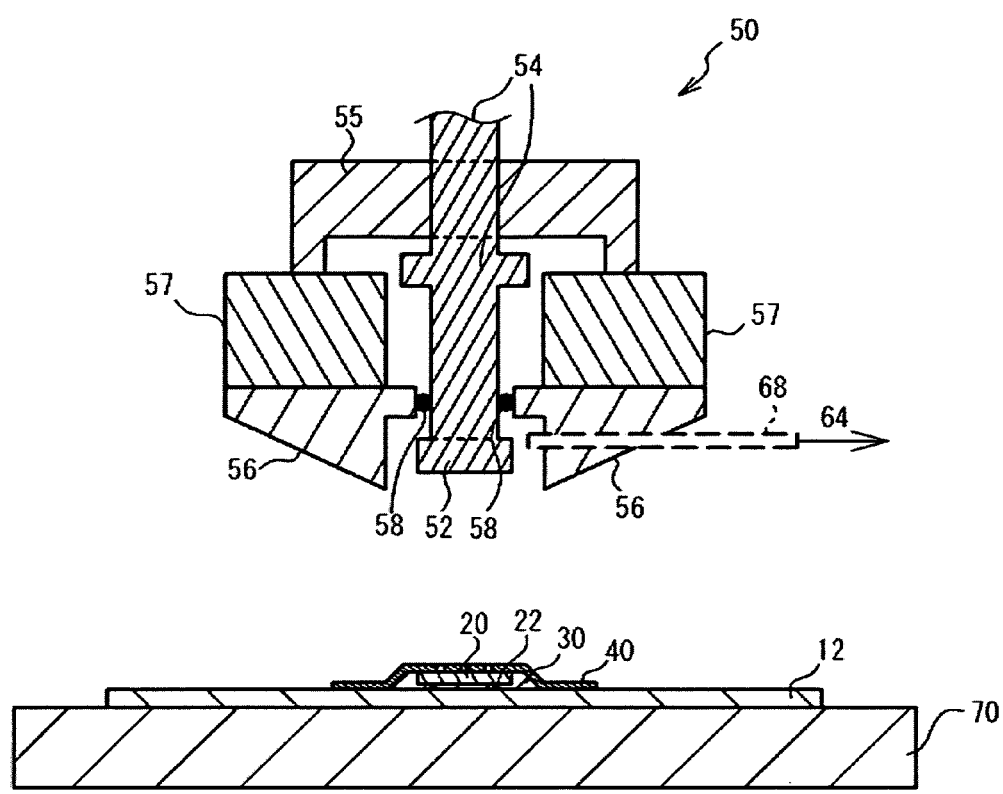
FIG. 4 illustrates the manufacturing method (fourth case) of the semiconductor device in accordance with the first embodiment.

As shown in FIG. 4, air 64 in the space 60 is released through an emission portion 68. Thus, the pressure in the space 60 changed to a normal one. The emission portion 68 is provided in the metal mold 56 and is schematically illustrated in FIG. 4. The metal mold 56 and the mount portion 54 are lifted. The resin sheet 40 is adhered to the under fill resin 30 and is left on the under fill resin 30 and on the semiconductor chip 20. The resin sheet 40 may be adhered to the under fill resin 30 and the semiconductor chip 20 with an adhesive agent.

Figure 5:
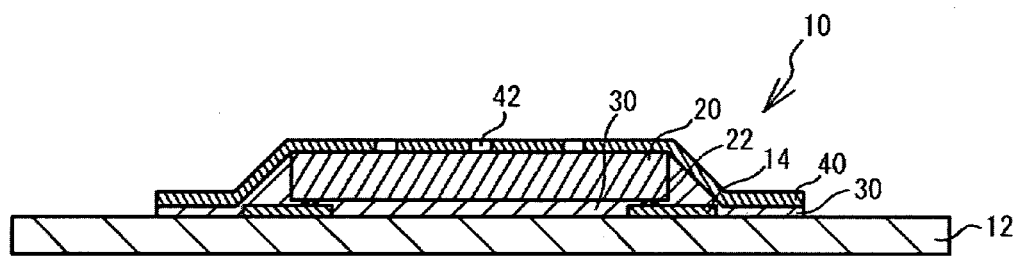
FIG. 5 illustrates a cross sectional view of the semiconductor device in accordance with the first embodiment.

FIG. 5 illustrates a cross sectional view of the semiconductor device 10 that is flip-chip mounted with the processes shown in FIG. 1 through FIG. 4. The electrode 14 is provided on the substrate 12. The semiconductor chip 20 is flip-chip mounted on the substrate 12 so that the electrode 14 is jointed to the bump 22. The under fill resin 30 is provided between the semiconductor chip 20 and the substrate 12 and surrounds the semiconductor chip 20. The resin sheet 40 is provided on the semiconductor chip 20 and on the under fill resin 30. The hole 42 is formed in the resin sheet 40 on the semiconductor chip 20. As shown in FIG. 1, the absorption portion 52 is able to absorb to the semiconductor chip 20 with vacuum through the hole 42.

Figure 6A:
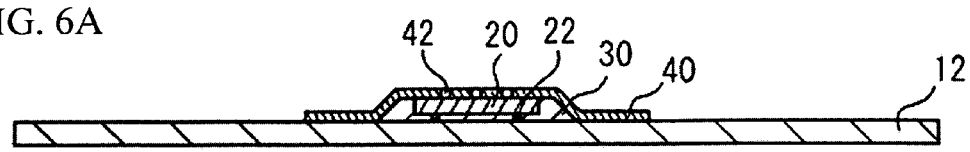
FIG. 6A through FIG. 6C illustrate a manufacturing method of the semiconductor device in accordance with the first embodiment.
Figure 6B:
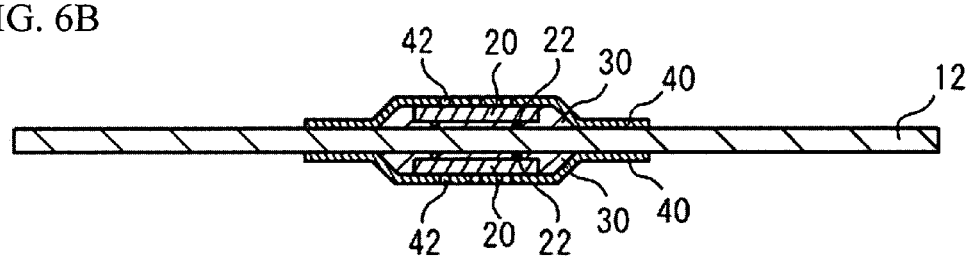
Figure 6C:
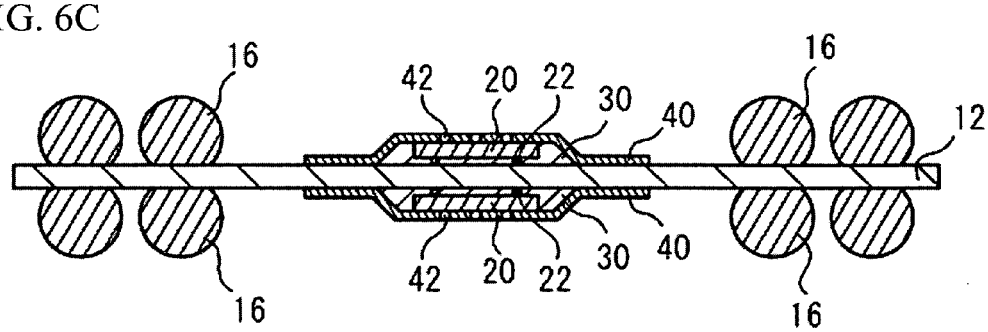

FIG. 6A illustrates the semiconductor device 10 shown in FIG. 5. An explanation of the semiconductor device 10 is omitted. As shown in FIG. 6B, another semiconductor chip 20 is flip-chip mounted on the back face of the substrate 12. As shown in FIG. 6C, a solder ball 16 is formed on both faces of the substrate 12 respectively. With the processes, the semiconductor device in accordance with the first embodiment is fabricated. In the first embodiment, the semiconductor chip 20 and the solder ball 16 are symmetrically formed on the front face and the back face of the substrate 12 respectively as shown in FIG. 6C. It is therefore possible to restrain a warpage of a package.

In a manufacturing method of the semiconductor chip in accordance with the first embodiment, the melted resin 32 is arranged on the substrate 12 as shown in FIG. 1. As shown in FIG. 2, the semiconductor chip 20 is arranged on the melted resin 32. The semiconductor chip 20 is subjected to a pressure, and the semiconductor chip 20 is flip-chip mounted on the substrate 12 as shown in FIG. 4 and FIG. 5. Further, the melted resin 32 is hardened in a condition where the melted resin 32 is pressed by air. And the under fill resin 30 (the resin portion) is formed. It is possible to restrain a formation of a void in the under fill resin 30, when the under fill resin 30 is made from the melted resin 32 with the melted resin 32 being subjected to a pressure by air. It is therefore possible to restrain a reduction of adhesiveness, thermal conductivity and humidity resistance of the under fill resin 30.

It is possible to restrain a formation of the void in the under fill resin 30, because the under fill resin 30 is subjected to an even pressure when the melted resin 32 is pressed with a fluid (that is, the melted resin 32 is subjected to a fluid pressure). In the first embodiment, the air (a gas) presses the melted resin 32. However, another fluid may be used. For example, oil or the like may be used.

The melted resin 32 may be pressed without the resin sheet 40. It is however preferable that the resin sheet 40 is arranged on the semiconductor chip 20 and on the melted resin 32 as shown in FIG. 2 in the first embodiment and the melted resin 32 is subjected to the fluid pressure through the resin sheet 40 as shown in FIG. 3. It is possible to form each of the under fill resin 30 having the same shape, if the resin sheet 40 is used and the melted resin 32 is arranged on a given region. That is, extra resin flows out from a space between the resin sheet 40 and the substrate 12 when the space 60 is subjected to a pressure in the process shown in FIG. 3, even if the melted resin 32 is large in drop quantity in the process shown in FIG. 1. It is therefore possible to form each of the under fill resin 30 having the same shape, even if the drop quantity of the melted resin 32 is changeable.

The pressure provided to the semiconductor chip 20 for flip-chip mounting may be the fluid pressure provided to the melted resin 32. It is however preferable that the pressure for flip-chip mounting is independent from that provided to the melted resin 32. In this case, the flip-chip mounting may be independent from the formation of the under fill resin 30.

As shown in FIG. 2, the metal mold 56 presses the resin sheet 40 to the substrate 12 so as to surround the semiconductor chip 20 when the semiconductor chip 20 is flip-chip mounted on the substrate 12. That is, the resin sheet 40 is pressed by the substrate 12 so as to surround the semiconductor chip 20 when the under fill resin 30 is formed, as shown in FIG. 3. In this case, the pressure in the space 60 is kept and the each shape of the resin sheets 40 is the same. It is therefore possible to form each of the under fill resins 30 having the same shape.

A manufacturing equipment (a flip-chip bonder) of the semiconductor chip in accordance with the first embodiment has the metal mold 56 (the press portion), the stage 70 and the mount portion 54. The metal mold 56 provides the fluid pressure to the melted resin arranged on the substrate 12. On the stage 70 (the resin formation portion), the melted resin 32 is hardened under the fluid pressure and the under fill resin 30 (the resin portion) is formed. The mount portion 54 presses the semiconductor chip 20 arranged on the melted resin 32 and flip-chip mounts the semiconductor chip 20 on the substrate 12. The formation of the void is restrained in the under fill resin 30, when the melted resin 32 is subjected to the fluid pressure.

The semiconductor device 10 manufactured with the manufacturing method in accordance with the first embodiment has the semiconductor chip 20 that is flip-chip mounted on the substrate 12 and the under fill resin 30 (the resin portion) that is provided between the semiconductor chip 20 and the substrate 12. The resin sheet 40 covers the semiconductor chip 20 and the under fill resin 30, and has a hole 42 on the semiconductor chip 20. It is therefore possible to restrain the formation of the void in the under fill resin 30 if the resin sheet 40 is provided. It is further possible to equalize each shape of the under fill resins 30. And the mount portion 54 may absorb to the semiconductor chip 20 through the resin sheet 40, if the resin sheet 40 has a hole 42 as shown in FIG. 1.

The structure of the press portion is not limited if the press portion provides the fluid pressure to the melted resin 32, although the press portion presses the melted resin 32 by pressing the space 60 in the metal mold 56, as shown in FIG. 2.

The temperature of the melted resin 32 is increased, the melted resin 32 is hardened, and the under fill resin 30 (the resin portion) is formed on the stage 70 acting as the resin formation portion, as shown in FIG. 3. The structure of the resin formation portion is not limited if the resin formation portion hardens the melted resin 32 being pressed by the fluid pressure.

As shown in FIG. 1, the mount portion 54 absorbs the semiconductor chip 20 to the absorption portion 52 and flip-chip mounts the semiconductor chip 20 on the substrate 12. However, the structure of the mount portion is not limited if the mount portion presses the semiconductor chip 20 and flip-chip mounts the semiconductor chip 20 on the substrate 12.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2007-023913 filed on Feb. 2, 2007, the entire disclosure of which is hereby incorporated by reference.

I claim:

1. A manufacturing method of a semiconductor device comprising:
    arranging a melted resin on a substrate;
    arranging a semiconductor chip on the melted resin;
    arranging a resin sheet on the melted resin and the semiconductor chip,
    the resin sheet comprising a plurality of holes;
    absorbing the semiconductor chip to a mounting portion through the plurality of holes;
    pressing the mounting portion with the semiconductor chip to flip-chip mount the semiconductor chip on the substrate; and
    hardening the melted resin to form a resin portion by applying a fluid pressure to the melted resin through the resin sheet.

2. The method as claimed in claim 1 wherein the arranging a resin sheet on the melted resin and on the semiconductor chip comprises adhering the resin sheet to the melted resin and the semiconductor chip with an adhesive agent.

3. The method as claimed in claim 2, wherein the arranging a resin sheet comprises pressing the resin sheet to the substrate so as to surround the semiconductor chip.

4. The method as claimed in claim 1, wherein the fluid pressure is generated by a gas.

5. The method as claimed in claim 1, wherein the resin sheet has a higher melting point than the melted resin.

6. A method for fabricating a flip-chip package, the method comprising:
    dispensing molten resin on a substrate;
    covering a semiconductor chip with a resin sheet, the resin sheet comprising a plurality of holes;
    absorbing the semiconductor chip to a mounting portion through the plurality of holes;
    clamping the semiconductor chip on the substrate with the mounting portion such that the semiconductor chip is dipped in the molten resin; and
    applying, by a press portion, a fluid pressure to the molten resin through the resin sheet,
    wherein the molten resin is hardened through the application of the fluid pressure.

7. The method as claimed in claim 6, further comprising:
    in response to hardening the molten resin, forming a resin portion from the molten resin.

8. The method as claimed in claim 6, further comprising:
    flip-chip mounting the semiconductor chip on the substrate by affixing the semiconductor chip to the substrate through the plurality of holes comprising the resin sheet.

9. The method as claimed in claim 6, wherein the resin sheet is adhered to the semiconductor chip with an adhesive agent.

10. The method as claimed in claim 7, wherein a formation of a void in the resin portion is restrained as a result of the application of the fluid pressure to the molten resin.

11. The method as claimed in claim 7, wherein a reduction of adhesiveness in the resin portion is restrained as a result of the application of the fluid pressure to the molten resin.

12. The method as claimed in claim 7, wherein a reduction of a thermal conductivity of the resin portion is restrained as a result of the application of the fluid pressure to the molten resin.

13. The method as claimed in claim 7, wherein a reduction of a resistance to humidity of the resin portion is restrained as a result of the application of the fluid pressure to the molten resin.

14. The method as claimed in claim 6, wherein the resin sheet has a higher melting point than the melted resin.

* * * * *